METHOD OF VACUUM DEPOSITION OF PIEZOELECTRIC FILMS OF CADMIUM SULFIDE

Filed Nov. 7, 1966

INVENTORS
J.M. STINCHFIELD
HAYDEN MORRIS
BY Harry M. Saragovitz
Edward J. Kelly, Herbert Berl
& J. D. Edgerton
ATTORNEYS United States Patent Office 3,466,191
Patented Sept. 9, 1969

3,466,191

METHOD OF VACUUM DEPOSITION OF PIEZO-ELECTRIC FILMS OF CADMIUM SULFIDE

James Maxwell Stinchfield, Bethesda, Md., and Hayden Morris, Washington, D.C., assignors to the United States of America as represented by the Secretary of the Army Filed Nov. 7, 1966, Ser. No. 592,640
Int. Cl. B44d *1/18;* C23c *13/02*
U.S. Cl. 117—213 8 Claims

ABSTRACT OF THE DISCLOSURE

Piezoelectric films of cadmium sulfide are prepared by vacuum deposition under controlled conditions. During the critical deposition period a mixture of argon and oxygen is admitted to the deposition apparatus while pumping is continued holding the pressure at $10^{-4}$ to $10^{-3}$ mm. of mercury.

The invention described herein may be used by or for the Government of the United States for governmental purposes without the payment to us of any royalty thereon.

The present invention relates to an improved process and apparatus for the preparation of vacuum deposited piezoelectric films for use in microwave transducers. More particularly, the present invention relates to an improved process and apparatus for the vacuum deposition of cadmium sulphide films in the preparation of transducers for converting electrical to ultrasonic energy in the frequency range above one gigacycle.

In the prior art, films of cadmium sulfide have been vacuum deposited for use in photosensitive applications, such as television Vidicon camera tubes, and for use in piezoelectric transducers, such as delay lines. The character of the vacuum deposited film used in each application is quite different. In the former, photosensitive, applications the preferred film is of a relatively soft and spongy nature. In the latter, piezoelectric, applications the film should be hard, insulating and crystallographically highly oriented.

While piezoelectrically active films have been deposited in the past, their preparation has not been consistently reproducible. Frequently films were produced which in color and general appearance looked good, but which showed little piezoelectric activity. A variety of post-evaporation heat treatments were then required in order to obtain good piezoelectric performance.

It is therefore an object of the present invention to provide a process and apparatus for use in the vacuum deposition of piezoelectric films of cadmium sulphide.

It is a further object to provide a process for the reproducible preparation of piezoelectrically active films of cadmium sulphide.

The invention, both as to its organization and method of operation, together with further objects and advantages thereof, will best be understood by reference to the following detailed description taken in connection with the accompanying drawings, in which.

Figures 1, 2:
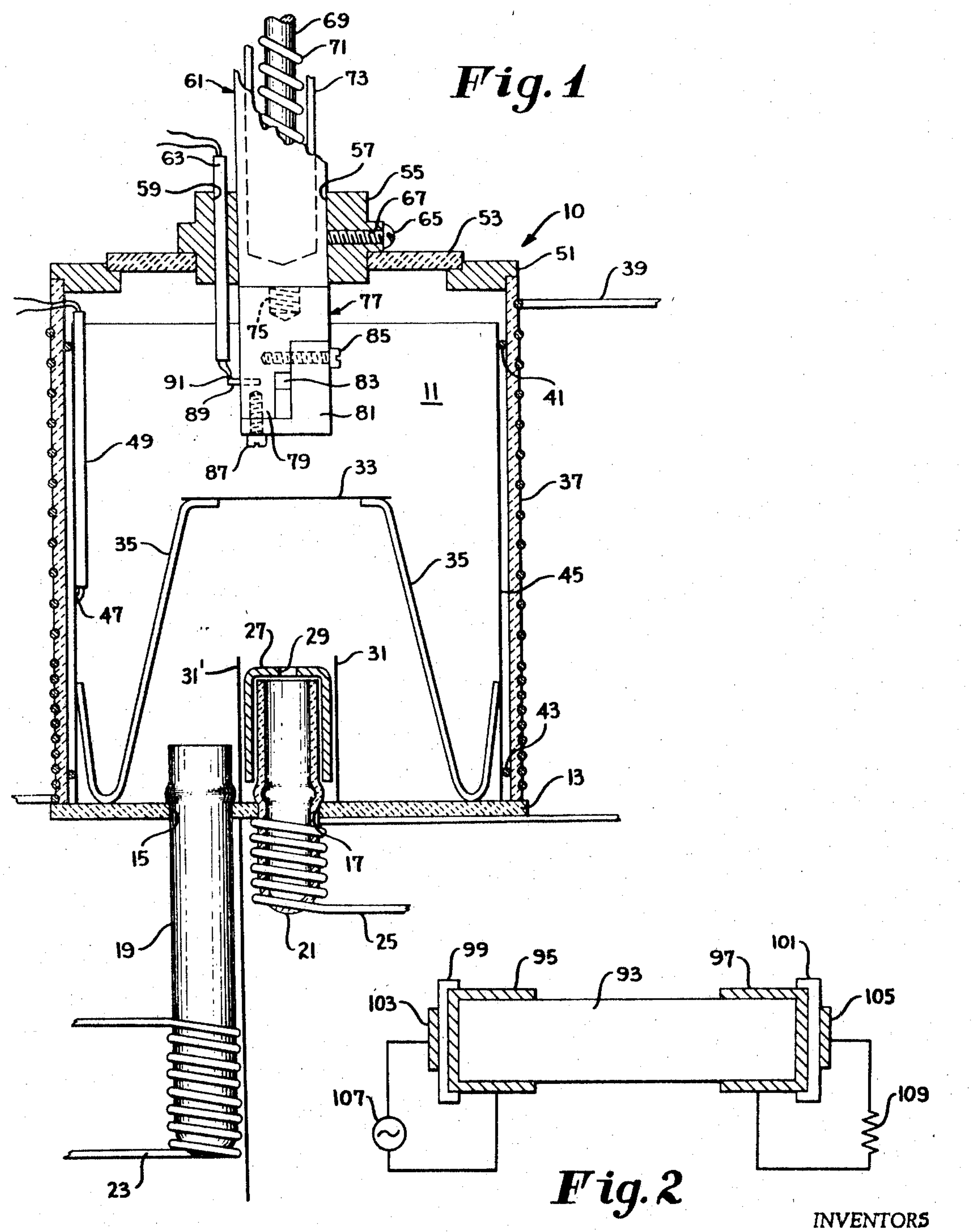
FIGURE 1 is a vertical sectional view of the vacuum deposition apparatus of the present invention.
FIGURE 2 is a vertical sectional view of a piezoelectric microwave transducer, as produced by the process and apparatus of the present invention, shown schematically connected to an electronic source and load.

In accordance with the process of the present invention, reproducible piezoelectric films of cadmium sulphide are prepared by vacuum deposition techniques. During the critical deposition period a mixture of argon and oxygen is admitted to the deposition apparatus while pumping is continued holding the pressure at $10^{-4}$ to $10^{-3}$ mm. of mercury. It has been found that cadmium sulphide films deposited in a controlled argon-oxygen atmosphere and at a controlled pressure consistently exhibit piezoelectric activity.

Referring to FIGURE 1, there is shown the inner portion of the vacuum deposition apparatus 10. The apparatus 10 is confined within a conventional vacuum bell jar, not shown, which is connected to suitable pumps to reduce the pressure, also not shown. The several pieces making up the apparatus 10 confine a smaller area 11 in which the actual deposition takes place.

A quartz base plate 13 is used to support the deposition apparatus and forms the lower boundary for the deposition area 11. The plate 13 has a pair of apertures 15 and 17 therein into which the sulfur 19 and the cadmium 21 quartz source tubes are placed. Separate sources are used for the cadmium and sulfur in view of the difference in vapor pressure of each of the materials. If a single source of cadmium sulphide were employed, the sulfur would vaporize more quickly than the cadmium upsetting the stoichiometry of the deposited film.

Separate electrical resistance heating coils 23 and 25 are placed about the lower portions of source tubes 19 and 21, respectively. Each of the heating coils has its own rheostat, not shown, in order to control the rate of vaporization of the cadmium and sulfur and in turn the composition of the deposited film.

The cadmium source tube 21 has a platinum cap 27 over its open end. The cap aids in preventing sulfur vapor from entering the cadmium source tube where it has a tendency to form a scum on the surface of the cadmium. The cap 27 has a small aperture 29 therein through which the cadmium vapor flows during the deposition run. Metal heat shields 31 and 31' limit transfer of radiant energy from high temperature source tube 21 to surrounding regions and the low temperature source tube 19.

In line with the opening in each of the source tubes and spaced a short distance above the tubes is a platinum baffle plate 33 which is supported by a plurality of platinum wire legs 35. The baffle plate shields the substrate upon which the cadmium sulphide is to be deposited from direct molecular beam from the sources and also protects the substrate from splashes of material. The baffle plate also shields the substrate from infrared radiation which would raise the substrate temperature. For best results the deposition should take place from the vapor phase. The baffle protects the substrate from any direct impingement of materials from the sources.

The side of the deposition area 11 is formed by a circular quartz shell 37 which is supported by the base plate 13. An electrical resistance heating element 39 is wrapped about the shell 37 and is used to determine the wall temperature within the deposition area 11.

Within the shell 37 and spaced therefrom by platinum wire spacers 41 and 43 is a circular platinum heat shield 45. The platinum heat shield protects the substrate from any direct infrared radiation from the heated quartz shell 37.

The tip 47 of a shielded thermocouple 49 is welded to the platinum heat shield 45. The thermocouple 49 is of platinum and platinum plus 10% rhodium, however, other thermocouples can be used which are capable of working over the same temperature range without contaminating the atmosphere in the deposition area 11. The thermocouple 49 provides an output voltage which, through regulating means, not shown, controls the heater 39 and in turn the temperature of the wall of the deposition area 11.

The top of the deposition area 11 is enclosed by a pair of concentric rings and by an adjustable support for the substrate holder. A dural or aluminum ring 51 is in direct contact with the quartz shell 37. Within the ring 51 and supported thereby is a ring of quartz 53. Within the ring of quartz 53 and supported thereby is a dural plug 55.

The plug 55 has a pair of vertical apertures therein 57 and 59 through which are slidably mounted the substrate holder 61 with an attached shielded thermocouple 63. A stainless steel adjusting screw 65 is threadably mounted in a horizontal aperture 67 in the plug 55. The screw 65 bears against the side of the substrate holder 61 maintaining it in any desired vertical position.

The substrate holder 61 has a hollow dural body into which there is coaxially mounted a quartz rod 69 about which a platinum resistance heating coil 71 is wrapped. A tubular quartz spacer 73 surrounds the heating coil 71 and protects it from contact with the metal substrate holder 61.

The lower end of the substrate holder 61 has a threaded stud 75 upon which there is threadably mounted the substrate holder vise 77. The vise 77 has a fixed jaw 79 and a movable jaw 81 between which a substrate 83 is shown mounted. Sufficient space is provided between the jaws of the vise for the mounting of several substrates if more than one transducer is to be prepared during a single deposition run. The movable jaw 81 is adjustably held by screws 85 and 87 which are threadably disposed in the fixed jaw 79.

A platinum pin 89 is mounted in the substrate holder vise 77 and projects a short distance therefrom. The tip 91 of the thermocouple 63 is welded to the exposed portion of pin 89. The thermocouple 63 along with a regulator means, not shown, determine the temperature of the substrate 83 by controlling the platinum wire heater 71.

In carrying out the process of the present invention, a piece of quartz or other suitable material of the desired configuration and having optically polished and parallel ends is used as the substrate. The quartz must be very carefully cleaned before the deposition so that the vacuum deposited film of cadmium sulphide will adhere to the surface. It has also been observed that poorly cleaned surfaces cause a change in the crystal structure of the deposited cadmium sulphide with a resulting loss in piezoelectric activity.

In preparing the quartz substrate, the samples are first given a chemical cleaning followed, if desired, by a cleaning in a glow discharge. The substrate is first washed in concentrated nitric acid and then in a strong sodium hydroxide solution. After being rinsed in distilled water the quartz substrate is given a final wash and rinse with spectroscopic grade isopropyl alcohol. If the cleaned quartz samples are not meant to be immediately used they should be stored in a vacuum desicator.

Usually the cleaned quartz substrates have gold films deposited on the ends, before being placed in the above described deposition apparatus. These gold films are usually deposited in a separate vacuum bell jar apparatus, although arrangements could be made to do this in the bell jar used for the deposition of the cadmium sulphide films.

For the glow discharge cleaning of the substrate, the sample should be placed in the substrate holder vise 77 with the ends to be cleaned exposed. The apparatus is then pumped down to approximately 0.1 mm. of mercury and a small amount of argon gas is then admitted. With suitable gas pressure and a high voltage between the substrate holder 61 and the heat shield 45 a glow discharge can be maintained in the deposition area 11. The glow discharge should be maintained for several minutes to insure that the substrate is clean. In practice, it is preferable to carry out the glow discharge cleaning immediately before the deposition run so that it is not necessary to use excessive pumping time.

One of the main problems encountered during the deposition, concerns the control of the cadmium source. If the cadmium source boils too vigorously, an excess of cadmium vapor tends to deposit and a low resistivity film results. On the other hand, if the cadmium source is too quiescent, a film forms on the surface of the cadmium and evaporation is very erratic. In order to control the cadmium source a charge melting run is carried out before the deposition run. During the charge melting run both the sulfur and cadmium are melted in order to bring the materials into good thermal contact with the quartz tube containers and to form a slight protective film on the cadmium source. Consequently, the control of these sources during the short time the desired film thickness is being deposited, is well regulated, and good reproducible results are obtained.

The charge melting run is usually made before the substrate holder is put in the apparatus. Otherwise the temperatures and pressures are at values near those for the deposition run, but for short times and with cadmium melted before sulfur instead of the reverse order used during the deposition run. A pure argon gas pressure is used during the charge melting run.

In the preferred method of the operation, the quartz substrate is first chemically cleaned and glow discharge cleaned, before the gold films are evaporated on its surfaces. The deposition run can follow this step if the substrate is not exposed to the atmosphere outside the bell jar for an appreciable length of time.

When the substrates are transferred from a gold film evaporation bell jar to the deposition bell jar and the elapsed time of exposure to the ambient atmosphere is long enough to contaminate the surfaces, then the glow discharge cleaning should be repeated in the deposition apparatus.

After this procedure the bell jar enclosing the deposition apparatus is evacuated to a pressure between $10^{-5}$ and $10^{-6}$ mm. of mercury before the various heaters are turned on in readiness for the vapor deposition.

The heaters are then turned on and the substrate is brought to a temperature of 190° C. plus or minus ten degrees. While still pumping on the bell jar a mixture of argon and eight to eighteen percent oxygen is leaked into the system. The input of gas in the system raises the pressure to between $10^{-4}$ and $10^{-3}$ mm. of mercury. The gas leak is controlled to maintain this pressure throughout the deposition run.

The heater 39 is energized in order to bring the temperature of the walls of the deposition are all up to approximately 150° C. This is done to prevent selective deposition of the source materials on the cool walls of the deposition apparatus.

The sulfur source heater 23 is then energized in order to vaporize the sulfur before the cadmium. The sulfur is heated to approximately 130° C. and controlled near this temperature throughout the deposition. After the sulfur has melted and begun to sublime the cadmium source heater 25 is energized in order to begin the generation of cadmium vapor. The cadmium source should be heated in the range of 600–630° C. and preferably 620° C. The temperature of the cadmium source and the vacuum pumping speed are used to control the rate of deposition. The cadmium source should be heated very shortly after the sulfur source in order to prevent the formation of cadmium sulfide on the surface of the cadmium source. The emerging cadmium vapor will preclude the entrance of sulfur vapor into the cadmium source during the deposition run.

The deposition should be continued for approximately 10 minutes in order to build up a sufficient thickness of cadmium sulfide approximately 1.2 microns, as determined by capacitance measurements. The deposited cadmium sulfide film should be insulating and also crystallographically highly oriented. When the substrate is held at a temperature between 180° C. and 200° C. hexagonal cadmium sulfide is deposited.

It has also been found under conditions where the deposited film is not as piezoelectrically active as anticipated, that the addition of a small amount of water vapor to the argon gas being leaked into the apparatus, will increase the piezoelectric activity of the film.

In FIGURE 2, there is shown an ultrasonic delay line having vacuum deposited cadmium sulfide transducers prepared according to the process of the present invention. The illustrated device is representative of a typical use to which piezoelectric films of cadmium sulfide are placed. The delay line comprises a quartz substrate 93 with gold electrodes 95 and 97 at each end thereof. In contact with each of the gold electrodes is a layer of cadmium sulfide 99 and 101, respectively. In contact with each of the cadmium sulfide layers there is a second pair of gold electrodes 103 and 105. Between electrodes 95 and 103 there is connected a source of microwave energy 107. Between electrodes 97 and 105 there is connected an electrical resistive load 109.

In operating the delay line, the cadmium sulfide transducer 99 converts the microwave electrical input from source 107 into ultrasonic waves which traverse the quartz block 93. The cadmium sulfide transducer 101 converts the ultrasonic waves to electrical energy which is then applied to load 109. Since the speed of the ultrasonic waves passing through the quartz is slower than the speed of a microwave signal traversing a conductor, the input signal is delayed in time before reaching the load.

The process and apparatus of the present invention has been found capable of reproducibly producing cadmium sulfide layers of high piezoelectric activity, the films being produced both quickly and easily.

We claim:

1. A method of vacuum depositing piezoelectric films of cadmium sulfide on a chemically cleaned substrate comprising the following steps:

(a) mounting the substrate in a suitable holder in a vacuum deposition apparatus;

(b) evacuating the deposition apparatus to a pressure of $10^{-5}$ to $10^{-6}$ mm. of mercury;

(c) leaking into the deposition apparatus a mixture of argon and 8 to 18% of oxygen, by volume, while continuing the evacuation to maintain the deposition chamber at a pressure of $10^{-3}$ to $10^{-4}$ mm. of mercury;

(d) heating the cleaned substrate to a temperature of 180° to 200° C.;

(e) heating the walls of the deposition chamber to above 130° C.;

(f) heating a source of sulfur in order to controllably generate sulfur vapor;

(g) heating a source of cadmium in order to controllably generate cadmium vapor;

(h) depositing a film of cadmium sulfide on the substrate.

2. A method of vacuum depositing piezoelectric films of cadmium sulfide on a chemically cleaned substrate as set forth in claim 1 wherein the sulfur source is heated to approximately 130° C.

3. A method of vacuum depositing piezoelectric films of cadmium sulfide on a chemically cleaned substrate as set forth in claim 1 wherein the cadmium source is heated between 610–630° C.

4. A method of vacuum depositing piezoelectric films of cadmium sulfide on a chemically cleaned substrate as set forth in claim 1 wherein the sulfur and cadmium sources are given a preliminary melt before the deposition run.

5. A method of vacuum depositing piezoelectric films of cadmium sulfide on a chemically cleaned substrate as set forth in claim 4 wherein the sulfur and cadmium source preparation comprises the following steps:

(a) mounting a source of cadmium vapor and a source of sulfur vapor in a vacuum deposition apparatus;

(b) evacuating the deposition apparatus;

(c) filling the deposition apparatus with argon gas;

(d) melting the cadmium in the cadmium vapor source to bring it into intimate contact with the walls of the source;

(e) melting the sulfur in the sulfur vapor source to bring it into intimate contact with the walls of the source;

(f) cooling the sources to solidify the source materials.

6. A method of vacuum depositing piezoelectric films of cadmium sulfide on a chemically cleaned substrate as set forth in claim 1 wherein the substrate is given a glow discharge cleaning after being mounted in the deposition apparatus.

7. A method of vacuum depositing piezoelectric films of cadmium sulfide on a chemically cleaned substrate as set forth in claim 6 wherein the glow discharge cleaning comprises the following steps:

(a) evacuating the deposition apparatus to approximately 0.1 mm. of mercury;

(b) leaking a small amount of argon gas into the apparatus;

(c) establishing a high potential between the substrate holder and the wall of the deposition apparatus to establish a glow discharge;

(d) maintaining the glow discharge for sufficient time to clean the substrate as judged by film adherence and piezoelectric activity.

8. A method of vacuum depositing piezoelectric films of cadmium sulfide on a chemically cleaned substrate as set forth in claim 1 wherein a small amount of water vapor is added to the mixture of argon and oxygen being leaked into the deposition apparatus to increase the piezoelectric activity of the deposited film.

References Cited

UNITED STATES PATENTS

| | | | |
|---|---|---|---|
| 3,127,282 | 3/1964 | Hershinger | 117—106 X |
| 3,361,591 | 1/1968 | Dill et al. | 117—106 X |
| 3,388,002 | 6/1968 | Foster | 117—201 X |

ANDREW G. GOLIAN, Primary Examiner

U.S. Cl. X.R.

117—93.1, 106, 201